United States Patent
Lee et al.

(10) Patent No.: US 11,289,334 B2
(45) Date of Patent: Mar. 29, 2022

(54) EPITAXIAL WAFER INCLUDING BORON AND GERMANIUM AND METHOD OF FABRICATING THE SAME

(71) Applicant: SAMSUNG ELECTRONICS CO., LTD., Suwon-si (KR)

(72) Inventors: Jung-A Lee, Suwon-si (KR); Yeonsook Kim, Hwaseong-si (KR); Inji Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 125 days.

(21) Appl. No.: 16/551,930

(22) Filed: Aug. 27, 2019

(65) Prior Publication Data
US 2020/0243338 A1    Jul. 30, 2020

(30) Foreign Application Priority Data
Jan. 30, 2019   (KR) .................. 10-2019-0012069

(51) Int. Cl.
*H01L 29/167*       (2006.01)
*H01L 21/02*        (2006.01)
(Continued)

(52) U.S. Cl.
CPC .... *H01L 21/2251* (2013.01); *H01L 21/02373* (2013.01); *H01L 21/02532* (2013.01); *H01L 21/02634* (2013.01); *H01L 21/30604* (2013.01); *H01L 21/324* (2013.01); *H01L 21/3225* (2013.01); *H01L 29/167* (2013.01); *H01L 27/14687* (2013.01)

(58) Field of Classification Search
None
See application file for complete search history.

(56) References Cited

U.S. PATENT DOCUMENTS 4,631,234 A    12/1986  Larrabee
7,258,739 B2    8/2007  Ono et al.
(Continued)

FOREIGN PATENT DOCUMENTS

JP    4817078 B2    11/2011
JP    5439675 B2    3/2014
(Continued)

OTHER PUBLICATIONS

M. Ogino et al., "The Diffusion Coefficient of Germanium in Silicon", Phys. Stat. Sol., 1982, (a) 72, pp. 535-541.
J. A. Kerr et al., "Strengths of Chemical Bonds", 1998, pp. 52-75.
K. R. Williams et al., "Etch Rates for Micromachining Processing—Part II", Journal of Microelectromechanical Systems, 2003, vol. 12, No. 6, pp. 761-778.
A. Neyfeh et al., "Effects of hydrogen annealing on heteroepitaxial-Ge layers on Si: Surface roughness and electrical quality", Appl. Phys. Lett., 2004, 85, pp. 2815-2817.
(Continued)

*Primary Examiner* — Daniel Whalen
(74) *Attorney, Agent, or Firm* — Lee IP Law, P.C.

(57) ABSTRACT

An epitaxial wafer and a method of fabricating an epitaxial wafer, the method including providing a semiconductor substrate doped with both boron and germanium such that a sum of boron concentration and germanium concentration is at least 8.5E+18 atoms/cm$^3$ and the germanium concentration is 6 times or less the boron concentration; forming an epitaxial layer on the semiconductor substrate such that the semiconductor substrate and the epitaxial layer constitute the epitaxial wafer; and annealing the epitaxial wafer for 1 hour or longer at a temperature of 1,000° C. or less.

20 Claims, 9 Drawing Sheets

(51) Int. Cl.
    *H01L 21/225*     (2006.01)
    *H01L 21/306*     (2006.01)
    *H01L 21/324*     (2006.01)
    *H01L 21/322*     (2006.01)
    *H01L 27/146*     (2006.01)

(56) References Cited

U.S. PATENT DOCUMENTS

| | | | |
|---|---|---|---|
| 7,341,787 | B2 | 3/2008 | Krautbauer et al. |
| 7,816,765 | B2 | 10/2010 | Ono |
| 2005/0176262 | A1* | 8/2005 | Ono .................. H01L 21/02532 438/770 |
| 2012/0032229 | A1 | 2/2012 | Deai et al. |
| 2017/0076959 | A1 | 3/2017 | Fujise et al. |
| 2018/0047586 | A1* | 2/2018 | Mueller .................. H01L 29/16 |

FOREIGN PATENT DOCUMENTS

| | | |
|---|---|---|
| KR | 10-2008-0106695 A | 12/2008 |
| WO | WO 2010/0116761 A1 | 10/2010 |

OTHER PUBLICATIONS

G. Taraschi et al., "Ultrathin Strained Si-on-Insulator and SiGe-on-Insulator Created using Low Temperature Wafer Bonding and Metastable Stop Layers", Journal of Electrochemical Society, 2004, 151 (1), pp. G47-G56.

T. Yamazaki et al., "A Study on Selective Etching of SiGe Layers in SiGe/Si Systems for Device Applications", Mat. Res. Soc. Symp. Proc., 2004, vol. 795.

H. Jiang et al., "Growth of misfit dislocation-free p/p$^+$ thick epitaxial silicon wafers on Ge—B-codoped substrates", Elsevier B.V., Physica B 376-377, 2006, pp. 841-844.

T. Salvetat et al., "Comparison Between Three $Si_{1-x}Ge_x$ versus Si Selective Etching Processes", ECS Transactions, 2008, 16 (10), pp. 439-449.

P. E. Acosta-Alba et al., "Surface self-diffusion of silicon during high temperature annealing", Journal of Applied Physics, 2014, 115, 134903.

J. Zhao et al., "Impact of germanium co-doping on oxygen precipitation in heavily boron-doped Czochralski silicon", Superlattices and Microstructures, 2016, 99, pp. 35-40.

"Impurity Profiles for Diffusion in Common Semiconductors", Diffusion Calculator and Graph, BYU Cleanroom, 2019.

* cited by examiner

EPITAXIAL WAFER INCLUDING BORON AND GERMANIUM AND METHOD OF FABRICATING THE SAME

CROSS-REFERENCE TO RELATED APPLICATION

Korean Patent Application No. 10-2019-0012069, filed on Jan. 30, 2019, in the Korean Intellectual Property Office, and entitled: "Epitaxial Wafer and Method of Fabricating the Same," is incorporated by reference herein in its entirety.

BACKGROUND

1. Field

Embodiments relate to an epitaxial wafer and a method of fabricating the same.

2. Description of the Related Art

Epitaxial layers may be formed to fabricate photodiodes of image sensors.

SUMMARY

The embodiments may be realized by providing a method of fabricating an epitaxial wafer, the method including providing a semiconductor substrate doped with both boron and germanium such that a sum of boron concentration and germanium concentration is at least 8.5E+18 atoms/cm$^3$ and the germanium concentration is 6 times or less the boron concentration; forming an epitaxial layer on the semiconductor substrate such that the semiconductor substrate and the epitaxial layer constitute the epitaxial wafer; and annealing the epitaxial wafer for 1 hour or longer at a temperature of 1,000° C. or less.

The embodiments may be realized by providing a method of fabricating an epitaxial wafer, the method including providing a semiconductor substrate in which boron and germanium are doped at a total concentration of 8.5E+18 atoms/cm$^3$ or greater; performing an epitaxial process in which the semiconductor substrate is used as a seed to form an epitaxial layer on the semiconductor substrate such that the epitaxial layer has a thickness of 5 μm or higher; and annealing on the semiconductor substrate for 1 hour or longer at a temperature of 900° C. to 950° C.

The embodiments may be realized by providing an epitaxial wafer including a silicon substrate doped with both boron and germanium; and a silicon epitaxial layer on the silicon substrate, the silicon epitaxial layer being doped with boron, wherein a sum of concentrations of the boron and the germanium doped in the silicon substrate is 8.5E+18 atoms/cm$^3$ or greater, the germanium concentration being 6 times or less the boron concentration, and a concentration of the boron in the silicon epitaxial layer is 1.0E+15 atoms/cm$^3$ or less.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
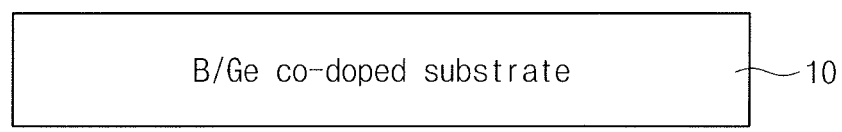
FIG. 1A illustrates a cross-sectional view of a semiconductor substrate doped with both boron and germanium according to some example embodiments.
Figure 1B:
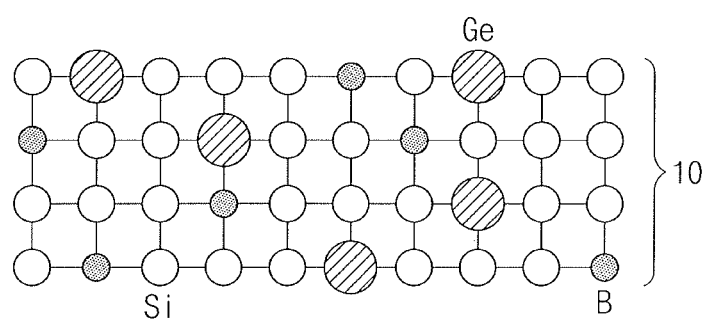
FIG. 1B illustrates a schematic diagram of a lattice structure of the semiconductor substrate depicted in FIG. 1A.

FIG. 1A illustrates a cross-sectional view of a semiconductor substrate doped with both boron and germanium according to some example embodiments. FIG. 1B illustrates a schematic diagram of a lattice structure of the semiconductor substrate depicted in FIG. 1A.

Referring to FIG. 1A, a semiconductor substrate 10 may be provided. The semiconductor substrate 10 may include a silicon (Si) substrate doped with, e.g., p-type impurities. The p-type impurities may include, e.g., boron (B). In an implementation, the semiconductor substrate 10 may have a boron concentration of, e.g., about 8.5E+18 (8.5×10$^{15}$) atoms/cm$^3$. In an implementation, the semiconductor substrate 10 may be relatively heavily doped with boron, and may have resistivity of about 0.01 Ωcm. The semiconductor substrate 10 may have reduced resistance for low power consumption of semiconductor devices. As discussed above, the semiconductor substrate 10 may be heavily doped with boron and may exhibit the properties described above.

In an implementation, as shown in FIG. 1B, boron may be substitutionally doped in the semiconductor substrate 10. For example, silicon atoms of the semiconductor substrate 10 may be replaced with boron atoms. According to Vegard's law, a solid solution has a lattice constant in proportion to a concentration of solute atoms. A change in lattice constant of silicon (e.g., as a result of doping with boron) in accordance with a variation in concentration of boron may be given by Vergard's law as shown in Equation 1 below. For example, a change in lattice constant between the undoped silicon semiconductor substrate 10 and the silicon semiconductor substrate 10 that has been doped with boron may be calculated according to Equation 1.

$$\Delta\alpha_{Si-B} = \alpha_{Si} \times (R_B - R_{Si})/R_{Si} \times C_B/C_{Si}$$ [Equation 1]

In Equation 1, $\alpha_{Si}$ indicates a lattice constant of pure silicon in which any element is not added at all. The lattice constant of pure silicon, $\alpha_{Si}$, is about 5.43 Å. $R_B$ indicates an atomic radius of boron, and $R_{Si}$ indicates an atomic radius of silicon. $C_B$ indicates a boron concentration per unit volume, and $C_{Si}$ indicates a silicon concentration per unit volume. The atomic radius of boron, $R_B$, is about 0.88 Å, and the atomic radius of silicon, $R_{Si}$, is about 1.17 Å. The silicon concentration per unit volume, $C_{Si}$, may be about 5.0E+22 atoms/cm³. When these numerical values are substituted into Equation 1, Equation 2 may be obtained as follows.

$$\Delta\alpha_{Si-B} = -2.69 \times 10^{-23} \times C_B$$ [Equation 2]

According to Equation 2, the semiconductor substrate 10 doped with boron may have a reduced lattice constant, and the change in lattice constant of (e.g., boron-doped) silicon, $\Delta\alpha_{Si-B}$, may increase with the boron concentration, $C_B$. For example, the lattice constant of silicon may decrease when the semiconductor substrate 10 is doped with boron whose atomic size is about 0.75 times that of silicon.

The semiconductor substrate 10 may further include other impurities in addition to boron. In an implementation, the other impurities may include, e.g., germanium (Ge). The semiconductor substrate 10 may include both boron and germanium during the ingot growth thereof. In an implementation, the semiconductor substrate 10 may be obtained by growing and slicing a silicon ingot including both boron and germanium.

In an implementation, as shown in FIG. 1B, germanium may be substitutionally doped in the semiconductor substrate 10. For example, silicon atoms may be replaced with germanium atoms. In an implementation, germanium atoms may replace ones of boron atoms in addition to silicon atoms. Like boron, a change in lattice constant of silicon (e.g., as a result of doping with germanium) in accordance with a variation in concentration of germanium may be given by Vergard's law as shown in Equation 3 below. For example, a change in lattice constant between the undoped silicon semiconductor substrate 10 and the silicon semiconductor substrate 10 that has been doped with germanium may be calculated according to Equation 3.

$$\Delta\alpha_{Si-Ge} = \alpha_{Si} \times (R_{Ge} - R_{Si})/R_{Si} \times C_{Ge}/C_{Si}$$ [Equation 3]

In Equation 3, $\alpha_{Si}$, $R_{Si}$, and $C_{Si}$ are the same as those discussed with reference to Equation 1. $R_{Ge}$ indicates an atomic radius of germanium, and $C_{Ge}$ indicates a germanium concentration per unit volume. The atomic radius of germanium, $R_{Ge}$, is about 1.22 Å. When these numerical values are substituted into Equation 3, Equation 4 may be obtained as follows.

$$\Delta\alpha_{Si-Ge} = 4.64 \times 10^{-24} \times C_{Ge}$$ [Equation 4]

According to Equation 4, the semiconductor substrate 10 doped with germanium may have an increased lattice constant, and the change in lattice constant of (e.g., germanium-doped) silicon, $\Delta\alpha_{Si-Ge}$, may increase with the germanium concentration, $C_{Ge}$. For example, the lattice constant of silicon may increase when the semiconductor substrate 10 is doped with germanium whose atomic size is about 1.04 times that of silicon.

When the semiconductor substrate 10 is doped with both boron and germanium, the semiconductor substrate 10 may have a change in lattice constant given by the following Equation 5, or the sum of Equation 2 and Equation 4.

$$|\Delta\alpha_{Si-B-Ge}| = |-2.69 \times 10^{-23} \times C_B + 4.64 \times 10^{-24} \times C_{Ge}|$$ [Equation 5]

According to Equation 5, when approximately 6 germanium atoms are present per boron atom, the change in lattice constant of the semiconductor substrate 10, $|\Delta\alpha_{Si-B-Ge}|$, may be about zero. For example, boron-induced strain may be completely or partially relieved by germanium having a concentration of about 6 times or less that of boron. As such, when the semiconductor substrate 10 is doped with both boron and germanium, it may be possible to suppress the change in lattice constant of the semiconductor substrate 10.

In an implementation, a relationship between the boron concentration $C_B$ and the germanium concentration $C_{Ge}$ may be denoted by Equations 6 and 7 below.

$$C_B : C_{Ge} \leq 1 : 6$$ [Equation 6]

In Equation 6, the germanium concentration $C_{Ge}$ may be at most 6 times the boron concentration $C_B$. In such a case, the change in lattice constant of the semiconductor substrate 10, $|\Delta\alpha_{Si-B-Ge}|$ expressed by Equation 5, may be zero or almost zero. If the germanium concentration $C_{Ge}$ were to be greater than 6 times the boron concentration $C_B$, a misfit dislocation could be re-generated in the semiconductor substrate 10.

In an implementation, a sum of the boron concentration and the germanium concentration in the doped semiconductor substrate 10 may be 8.5E+18 atoms/cm³ or greater, as seen in Equation 7.

$$C_B + C_{Ge} \geq 8.5E+18 \text{ atoms/cm}^3$$ [Equation 7]

In an implementation, the minimum value 8.5E+18 atoms/cm³ may be the same as or similar to an initial concentration of boron in the semiconductor substrate 10.

Figure 2A:
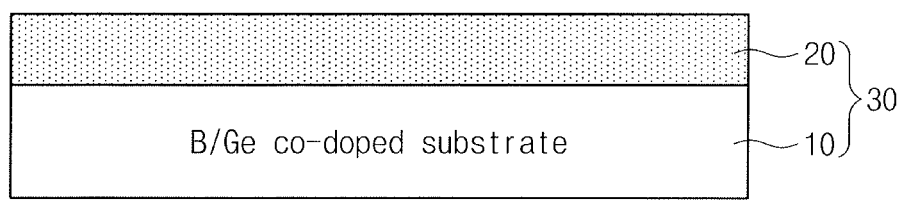
FIG. 2A illustrates a cross-sectional view of an epitaxial wafer according to some example embodiments.
Figure 2B:
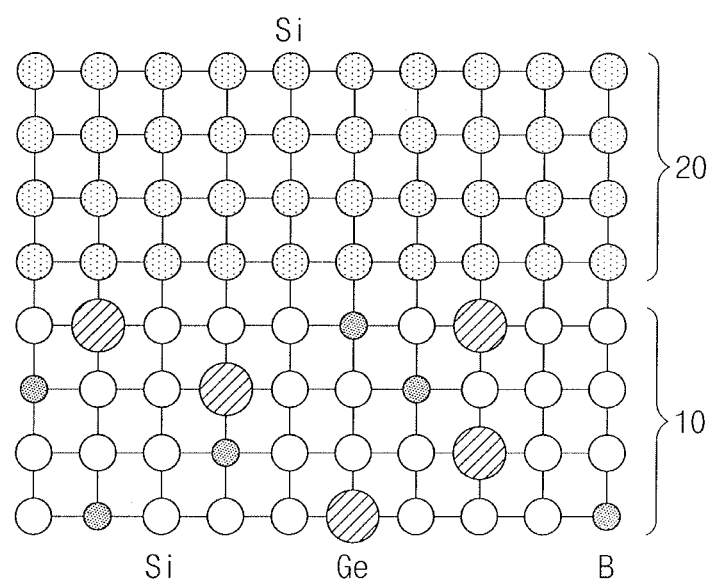
FIG. 2B illustrates a schematic diagram of a lattice structure of the epitaxial wafer depicted in FIG. 2A.

FIG. 2A illustrates a cross-sectional view of an epitaxial wafer according to some example embodiments. FIG. 2B illustrates a schematic diagram showing a lattice structure of the epitaxial wafer depicted in FIG. 2A.

Referring to FIG. 2A, an epitaxial layer 20 may be formed on the semiconductor substrate 10 to fabricate an epitaxial wafer 30. For example, the epitaxial layer 20 may be formed by an epitaxial process in which the semiconductor substrate 10 is used as a seed. The epitaxial layer 20 may include silicon. In an implementation, the epitaxial layer 20 may have a lattice constant of about 5.43 Å.

In an implementation, p-type impurities such as boron (B) may be doped into the epitaxial layer 20. The epitaxial layer 20 may have a boron concentration that is less than that of the semiconductor substrate 10. In an implementation, boron doped in the epitaxial layer 20 may have a concentration of, e.g., about 1.0E+15 atoms/cm³ or less. The epitaxial layer 20 may be relatively lightly doped with boron, and may have a resistivity equal to or greater than about 10 Ωcm, which may be higher than resistivity (e.g., about 0.01 Ωcm) of the semiconductor substrate 10 that is relatively heavily doped with boron.

Figure 3A:
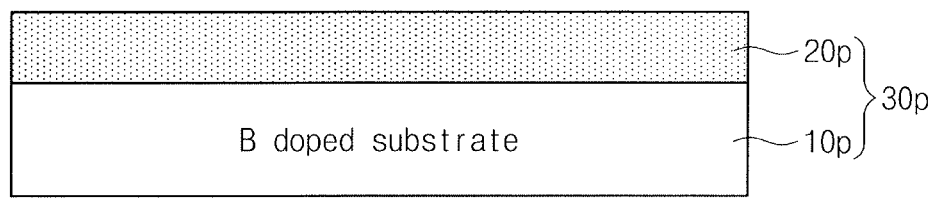
FIG. 3A illustrates a cross-sectional view of an epitaxial wafer according to a Comparative Example.
Figure 3B:
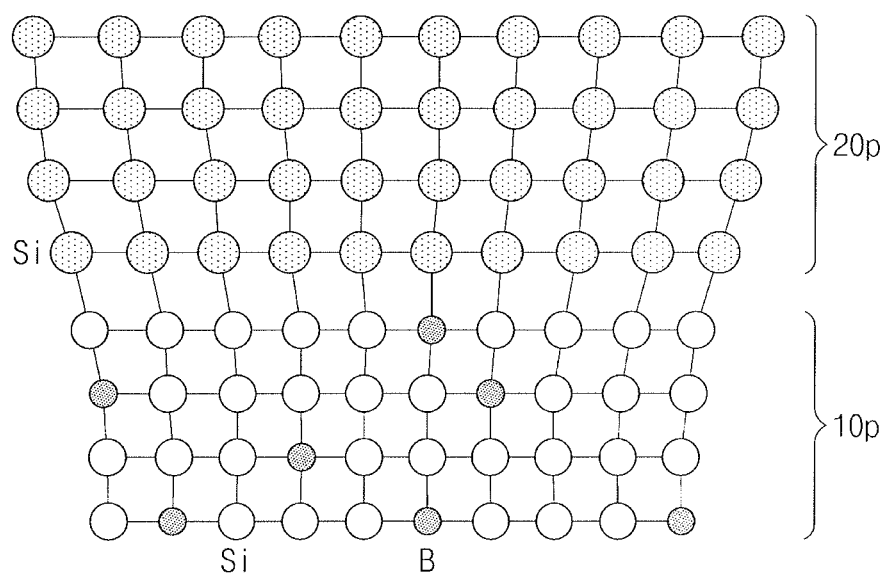
FIGS. 3B and 3C illustrate schematic diagrams of a lattice structure of the epitaxial wafer depicted in FIG. 3A.
Figure 3C:
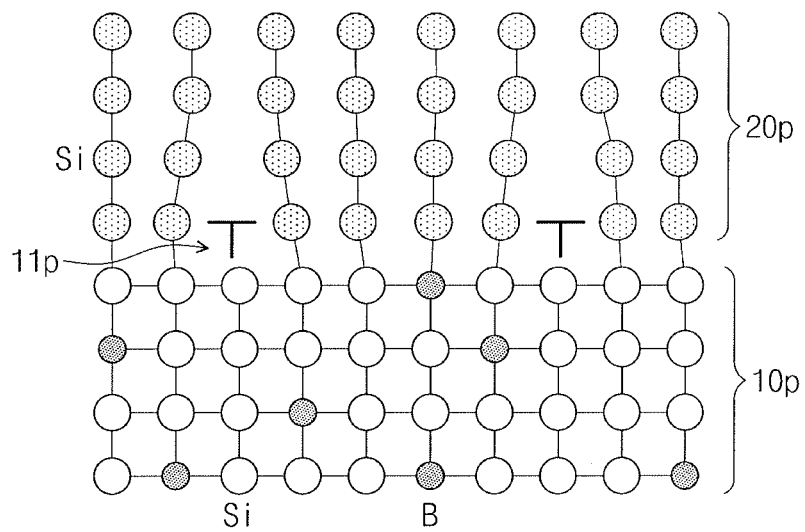

FIG. 3A illustrates a cross-sectional view showing an epitaxial wafer according to a Comparative Example. FIGS. 3B and 3C illustrates schematic diagrams showing a lattice structure of the epitaxial wafer depicted in FIG. 3A.

As shown in FIG. 3A, an epitaxial layer 20p may be formed on a semiconductor substrate 10p doped with boron and not doped with germanium. For example, as shown in FIG. 3B, an epitaxial wafer 30p may be fabricated to have a metastable state in which lattice mismatch possibly occurs between the semiconductor substrate 10p and the epitaxial layer 20p. The epitaxial layer 20p may be subject to tensile strain caused by the lattice mismatch. When the epitaxial layer 20p has a relatively smaller thickness, the epitaxial layer 20p may endure the tensile strain. When the epitaxial layer 20p has a relatively larger thickness, as shown in FIG. 3C, the epitaxial layer 20p may be introduced thereinto with misfit dislocations such as edge dislocations 11p for strain relaxation.

According to some example embodiments, as shown in FIG. 2B, co-doping of boron and germanium may help suppress the change in lattice constant of the semiconductor substrate 10, and thus no lattice mismatch may occur between the semiconductor substrate 10 and the epitaxial layer 20. Accordingly, it may be likely that no misfit dislocations are present in the epitaxial wafer 30.

Referring back to FIGS. 2A and 2B, the change in lattice constant of the semiconductor substrate 10, $|\Delta\alpha_{Si-B-Ge}|$ expressed by Equation 5, may be zero or almost zero. Therefore, Equation 5 may be converted into Equation 8 below.

$$|\Delta\alpha_{Si-B-Ge}| = |-2.69 \times 10^{-23} \times C_B + 4.64 \times 10^{-24} \times C_{Ge}| \leq \delta \quad \text{[Equation 8]}$$

In Equation 8, δ may indicate a certain constant that denotes the degree of lattice mismatch in the semiconductor substrate 10 on which the epitaxial layer 20 can be formed without the occurrence of misfit dislocations. As discussed below with reference to FIG. 4, δ may influence a thickness of the epitaxial layer 20.

Figure 4:
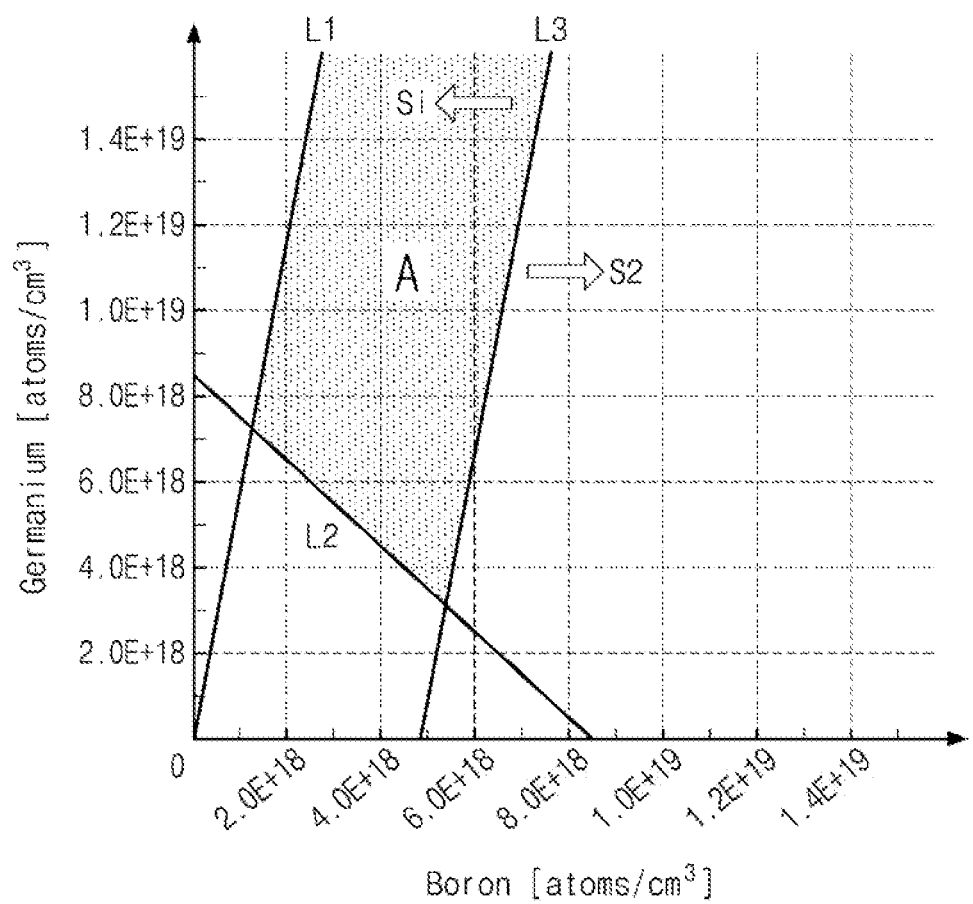
FIG. 4 illustrates a graph of a relationship between concentrations of boron and germanium according to some example embodiments.

FIG. 4 illustrates a graph showing a relationship between concentrations of boron and germanium according to some example embodiments. In FIG. 4, a horizontal axis indicates the boron concentration $C_B$, and a vertical axis indicates the germanium concentration $C_{Ge}$.

Referring to FIG. 4, a line L1 may denote a linear function of Equation 6, and doping concentrations of boron and germanium may be selected from a right-side region of the line L1. A line L2 may denote a linear function of Equation 7, and a total doping concentration of boron and germanium may be selected from an upper-side region of the line L2. A line L3 may denote a linear function of Equation 8, and doping concentrations of boron and germanium may be selected from a left-side region of the line L3. For example, the boron concentration $C_B$ and the germanium concentration $C_{Ge}$ may be selected from a region "A" surrounded by the lines L1, L2, and L3.

The line L3 may translate or move to the left or right depending on a value of δ. When the value of δ decreases, the line L3 may move to the left (S1), and when the value of δ increases, the line L3 may move to the right (S2). In the graph of FIG. 4, the phrase "the value of δ decreases" means "the germanium concentration $C_{Ge}$ becomes proportionally larger" and vice versa. This situation may suggest that germanium alleviates strain caused by boron, and that an increase in germanium concentration $C_{Ge}$ accelerates relaxation of strain.

An increase in germanium concentration $C_{Ge}$ may accelerate relaxation of strain, and a high concentration of germanium may facilitate the formation of the epitaxial layer 20 with a large thickness. For example, the epitaxial layer 20 may be formed to have a thickness of 5 μm to 20 μm without the occurrence of misfit dislocations. In an implementation, the epitaxial layer 20 may also be formed to have a thickness greater than about 20 μm without the occurrence of misfit dislocations.

Figure 5A:
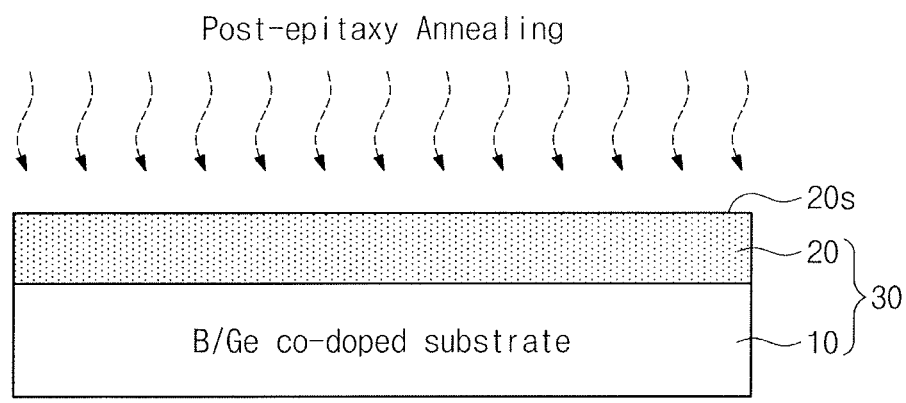
FIG. 5A illustrates a cross-sectional view of an annealing process on an epitaxial wafer according to some example embodiments.
Figure 5B:
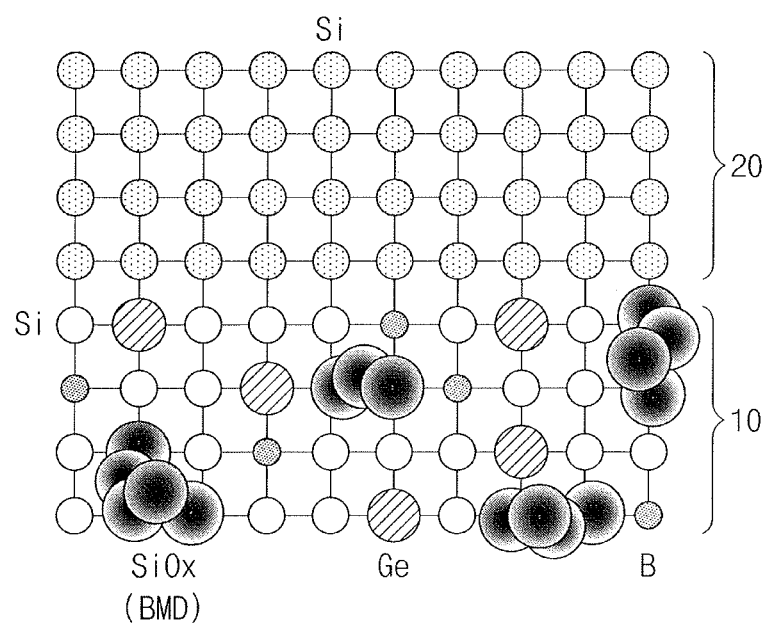
FIG. 5B illustrates a schematic diagram of a lattice structure of the epitaxial wafer depicted in FIG. 5A.

FIG. 5A illustrates a cross-sectional view showing an annealing process on an epitaxial wafer according to some example embodiments. FIG. 5B illustrates a schematic diagram showing a lattice structure of the epitaxial wafer depicted in FIG. 5A.

Referring to FIG. 5A, after the epitaxial layer 20 is formed, a post-epitaxy annealing process may be performed. The post-epitaxy annealing process may be carried out to increase gettering efficiency of the semiconductor substrate 10 and/or quality of the epitaxial layer 20.

To obtain gettering efficiency, an oxygen precipitate (OP) or a bulk micro defect (BMD) may be formed. The formation of the oxygen precipitate and the bulk micro defect may need oxygen and vacancies within the semiconductor substrate 10 as shown in Equations 9 and 10 below.

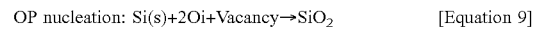

OP nucleation: Si(s)+2Oi+Vacancy→SiO$_2$ [Equation 9]

In Equation 9, Oi may indicate interstitial oxygen introduced into an interstitial site between lattices.

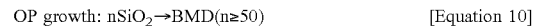

OP growth: nSiO$_2$→BMD(n≥50) [Equation 10]

The interstitial oxygen Oi may be introduced during or after the formation of the semiconductor substrate 10 and may have a concentration equal to or greater than about 1.0E+18 atoms/cm$^3$. When the semiconductor substrate 10 is doped with both boron and germanium, a large number of vacancies may be formed in the semiconductor substrate 10. For example, as shown in FIG. 5B, the semiconductor substrate 10 may be advantageous to the formation of the oxygen precipitate.

In an implementation, the oxygen precipitate may be nucleated in the epitaxial growth process for the formation of the epitaxial layer 20 shown in FIG. 2A, and then may be grown in the post-epitaxy annealing process shown in FIG. 5A. A compressive strain may be generated around the oxygen precipitate or the bulk micro defect, and as a result, the oxygen precipitate or the bulk micro defect may serve as a gettering site to gather metal contamination. For example, the epitaxial wafer 30 may increase in intrinsic gettering efficiency.

The post-epitaxy annealing process may help reduce roughness of a surface 20s of the epitaxial layer 20 and also may help remove defects from the epitaxial layer 20. When the post-epitaxy annealing process is performed at high temperatures, the bulk micro defect may exponentially increase in size and the epitaxial layer 20 may increase in surface smoothing effect.

Boron may be trapped by germanium as a co-dopant, and then turn into a boron-germanium pair, which may result in a reduction in diffusivity of boron. For example, the higher concentration of germanium, the lower diffusivity of boron. However, when the post-epitaxy annealing process is performed at high temperatures, the diffusivity of boron may become larger. For example, the post-epitaxy annealing process may be performed at temperatures sufficient to suppress side effects (e.g., out-diffusion of boron) caused by the diffusion of boron.

In an implementation, the post-epitaxy annealing process may be performed for about 1 hour or longer at a temperature equal to or less than about 1,000° C., e.g., about 900° C. to about 950° C. Preferably, the post-epitaxy annealing process may be performed for 1 hour. Even when the post-epitaxy annealing process is performed only once, it may be possible to reduce diffusion of boron while improving gettering efficiency and surface smoothing effect. The post-epitaxy annealing process may be performed under an atmosphere of an inert gas (e.g., Ar), or a mixed gas of hydrogen ($H_2$) and an inert gas (e.g., Ar). Hydrogen ($H_2$) may be included in the mixed gas in an amount of about 10 volume percent or less.

The epitaxial wafer 30 shown in FIG. 5A may be utilized to fabricate an image sensor. To measure distances or recognize human faces, an infrared (IR) sensor may use light with a long wavelength (e.g., about 940 nm) beyond a wavelength band (e.g., about 810 nm) perceptible to human eyes. However, an increase in wavelength of light may decrease absorption efficiency of silicon and in turn may reduce quantum efficiency. For example, a relatively thick photodiode may be formed, or a thick epitaxial layer free of defects may be formed.

In an implementation, as discussed above with reference to FIG. 4, the epitaxial layer 20 may be formed to have a thickness of about 5 μm to about 20 μm, or equal to or greater than about 20 μm, without the occurrence of misfit dislocations. For example, the epitaxial wafer 30 of an embodiment may be employed to fabricate an image sensor that uses light with a long wavelength (e.g., about 940 nm).

A wet etching process may be performed to reduce a thickness of the epitaxial wafer 30 so as to manufacture a backside illumination (BSI) image sensor with improved photosensitivity. This will be discussed below with reference to FIG. 6.

Figure 6:
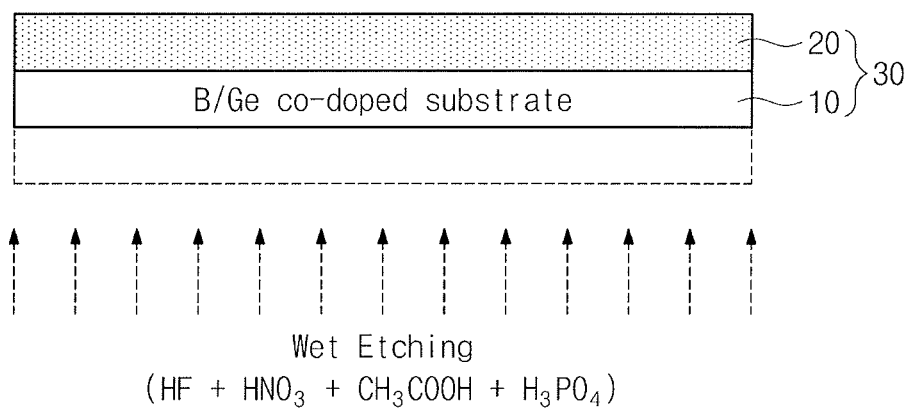
FIG. 6 illustrates a cross-sectional view of a wet etching process on an epitaxial wafer according to some example embodiments.

FIG. 6 illustrates a cross-sectional view showing a wet etching process on an epitaxial wafer according to some example embodiments.

Referring to FIG. 6, the semiconductor substrate 10 may be thinned by a wet etching process that uses an etchant including, e.g., hydrofluoric acid (HF), nitric acid ($HNO_3$), acetic acid ($CH_3COOH$), and phosphoric acid ($H_3PO_4$). As shown in Equation 11 below, nitric acid ($HNO_3$) may be used as an oxidizing agent that oxidizes silicon (Si) into silicon oxide ($SiO_2$); silicon oxide ($SiO_2$) may react with hydrofluoric acid (HF) and then be etched.

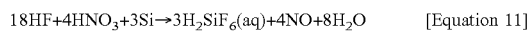

$$18HF+4HNO_3+3Si \rightarrow 3H_2SiF_6(aq)+4NO+8H_2O \quad \text{[Equation 11]}$$

The oxidation reaction caused by nitric acid ($HNO_3$) may be the slowest reaction that determines the overall reaction rate. Acetic acid ($CH_3COOH$) and phosphoric acid ($H_3PO_4$) may adjust a total amount of nitric acid ($HNO_3$) and the etchant, thereby controlling the reaction rate.

A silicon substrate heavily doped with boron may be removed at relatively high etch rates. It may be understood that an oxidation reaction that controls etching of the silicon substrate heavily doped with boron may be performed at high rates. Oxidation of silicon-germanium (SiGe) may be faster than oxidation of silicon (Si), and an increase in germanium concentration may raise an etching rate of silicon-germanium (SiGe). A bonding energy between a silicon atom and a germanium atom (Si—Ge) and between germanium atoms (Ge—Ge) may be less than a bonding energy between silicon atoms (Si—Si) and between a silicon atom and a boron atom (Si—B). Based on this fact, it may be found that the semiconductor substrate 10 doped with both boron and germanium may be rapidly etched by the etchant including hydrofluoric acid (HF), nitric acid ($HNO_3$), acetic acid ($CH_3COOH$), and phosphoric acid ($H_3PO_4$). In addition, an etch selectivity may be secured between the semiconductor substrate 10 and the epitaxial layer 20.

As discussed above, the epitaxial wafer 30, including the epitaxial layer 20 formed on the semiconductor substrate 10 doped with both boron and germanium, may be fabricated without the occurrence of misfit dislocations caused by lattice mismatch and without thickness limitation of the epitaxial layer 20, thereby exhibiting superior electrical characteristics. Further, after the formation of the epitaxial layer 20, the post-epitaxy annealing process may be performed to help prevent metal contamination and also to increase quality of the epitaxial layer 20. Moreover, the semiconductor substrate 10 may be wet-etched at high rates, and thus productivity may be increased.

Figure 7A:
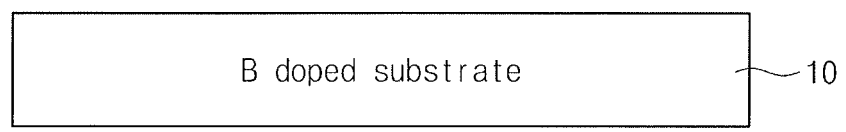
FIG. 7A illustrates a cross-sectional view of a semiconductor substrate doped with boron according to some example embodiments.
Figure 7B:
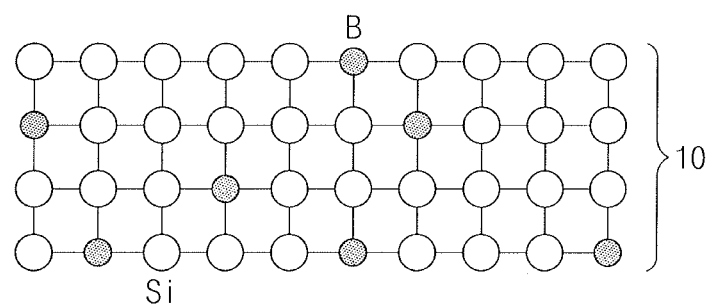
FIG. 7B illustrates a schematic diagram of a lattice structure of the semiconductor substrate depicted in FIG. 7A.

FIG. 7A illustrates a cross-sectional view showing a semiconductor substrate doped with boron according to some example embodiments. FIG. 7B illustrates a schematic diagram showing a lattice structure of the semiconductor substrate depicted in FIG. 7A.

Referring to FIG. 7A, a semiconductor substrate 10 doped with boron (B) may be provided. As shown in FIG. 7B, boron may be substitutionally doped in the semiconductor substrate 10. Boron may be heavily doped at a concentration of about 8.5E+18 atoms/$cm^3$, and the semiconductor substrate 10 may have resistivity of about 0.01 Ωcm. The previous descriptions associated with Equations 1 and 2 may be identically or similarly applicable to the present embodiment.

Figure 8A:
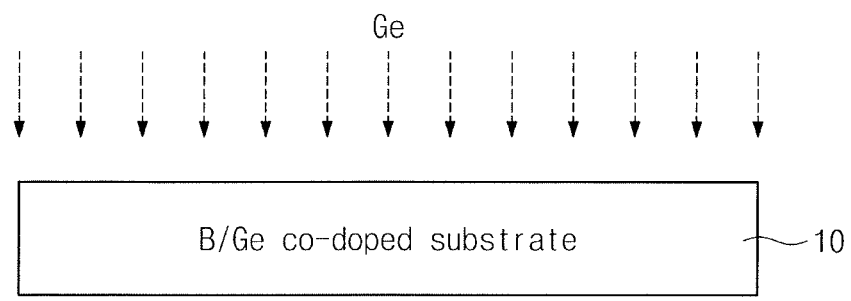
FIG. 8A illustrates a cross-sectional view of a doping process in which germanium is doped in a semiconductor substrate according to some example embodiments.
Figure 8B:
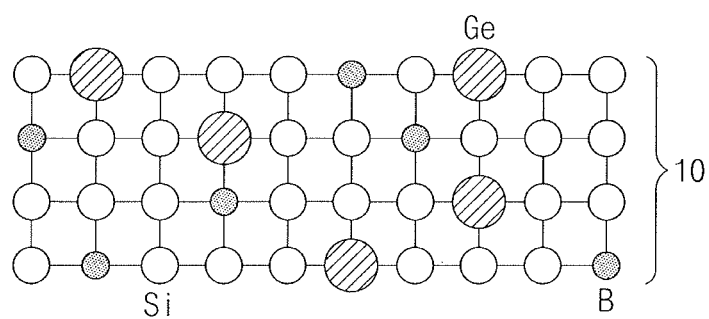
FIG. 8B illustrates a schematic diagram of a lattice structure of the semiconductor substrate depicted in FIG. 8A.

FIG. 8A illustrates a cross-sectional view showing a germanium doping process on a semiconductor substrate according to some example embodiments. FIG. 8B illustrates a schematic diagram showing a lattice structure of the semiconductor substrate depicted in FIG. 8A.

Referring to FIG. 8A, germanium may be doped in the (boron-doped) semiconductor substrate 10. Thus, it may be possible to obtain the semiconductor substrate 10 doped with both boron and germanium. As shown in FIG. 8B, germanium may be substitutionally doped in the semiconductor substrate 10. The previous descriptions associated with Equations 3 to 7 and FIG. 4 may be identically or similarly applicable to the present embodiment.

In an implementation, as shown in FIGS. 7A and 8A, germanium may be doped in the semiconductor substrate 10 (that has already been doped with boron). In an implementation, boron may be doped in the semiconductor substrate 10 that has already been doped with germanium. In an implementation, one of boron and germanium may be first doped in the semiconductor substrate 10 in which no impurities are doped, and then the other of boron and germanium may be later doped in the semiconductor substrate 10. In an implementation, both boron and germanium may be simultaneously doped in the semiconductor substrate 10 in which no impurities are doped.

As shown in FIGS. 2A and 2B, an epitaxial layer 20 may be formed on the semiconductor substrate 10 to fabricate an epitaxial wafer 30, and as shown in FIGS. 5A and 5B, the epitaxial wafer 30 may undergo a post-epitaxy annealing process. The previous descriptions associated with Equations 8 to 10 may be identically or similarly applicable to the present embodiment.

Like the previous embodiments, the epitaxial wafer 30 may be used to fabricate an image sensor. Furthermore, a wet etching process may be performed on the epitaxial wafer 30 to fabricate a backside illumination (BSI) image sensor.

By way of summation and review, to utilize long-wavelength light, thicknesses of photodiodes may increase. An increase in thicknesses of epitaxial layers may be used to increase thicknesses of photodiodes. Misfit dislocations could be generated due to lattice mismatch between an epitaxial layer and a semiconductor substrate.

According to an embodiment, a semiconductor substrate doped with both boron and germanium may be fabricated to help reduce or eliminate lattice mismatch between the semiconductor substrate and its overlying epitaxial layer.

Accordingly, it may be possible to prevent the occurrence of misfit dislocations caused by lattice mismatch and thus to obtain an epitaxial wafer with excellent electrical characteristics.

In addition, an annealing process may be performed after the formation of the epitaxial layer, and as a result, the epitaxial wafer may be fabricated while preventing metal contamination and also to have superior gettering efficiency. In addition, the epitaxial layer may be formed to have a thickness as large as desired, and thus it may be possible to manufacture an image sensor using long-wavelength light.

One or more embodiments may provide an epitaxial wafer free of misfit dislocations due to elimination of lattice mismatch.

One or more embodiments may provide an epitaxial wafer with improved gettering efficiency and effective to prevent metal contamination.

One or more embodiments may provide a method of fabricating an epitaxial wafer, in which method both boron and germanium are doped in a semiconductor substrate.

One or more embodiments may provide a method of fabricating an epitaxial wafer, which method employs a post-epitaxy annealing process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating an epitaxial wafer, the method comprising:
   providing a semiconductor substrate doped with both boron and germanium such that a sum of boron concentration and germanium concentration is at least $8.5E+18$ atoms/cm$^3$, the boron concentration is less than $2.2E+19$ atoms/cm$^3$, and the germanium concentration is 6 times or less the boron concentration;
   forming an epitaxial layer on the semiconductor substrate such that the semiconductor substrate and the epitaxial layer constitute the epitaxial wafer; and
   annealing the epitaxial wafer for 1 hour or longer at a temperature of 1,000° C. or less.

2. The method as claimed in claim 1, wherein providing the semiconductor substrate includes:
   forming a silicon ingot including the boron and the germanium; and
   slicing the silicon ingot to form a silicon substrate.

3. The method as claimed in claim 1, wherein providing the semiconductor substrate includes:
   forming a silicon ingot doped with one of the boron and the germanium,
   slicing the silicon ingot to form a silicon substrate doped with the one of the boron and the germanium; and
   doping the silicon substrate with the other of the boron and the germanium.

4. The method as claimed in claim 1, wherein annealing the epitaxial wafer is performed at a temperature of 900° C. to 950° C. under an atmosphere of an inert gas or a mixed gas of an inert gas and hydrogen gas.

5. The method as claimed in claim 4, wherein annealing the epitaxial wafer includes introducing the semiconductor substrate with oxygen to form a gettering site, the semiconductor substrate having an oxygen concentration of $1.0E+18$ atoms/cm$^3$ or higher.

6. The method as claimed in claim 4, wherein:
   annealing the epitaxial wafer is performed under the atmosphere of the mixed gas of the inert gas and hydrogen gas, and
   the hydrogen gas is included in the mixed gas in an amount of 10 volume percent or less.

7. The method as claimed in claim 1, wherein:
   forming the epitaxial layer includes forming a silicon epitaxial layer using an epitaxial growth process in which the semiconductor substrate is used a seed, and
   the silicon epitaxial layer has a thickness of 5 μm or higher.

8. The method as claimed in claim 1, further comprising doping the epitaxial layer with boron,
   wherein a boron concentration of the epitaxial layer is less than the boron concentration of the semiconductor substrate or less than the sum of the boron concentration and the germanium concentration.

9. The method as claimed in claim 1, further comprising thinning the semiconductor substrate after annealing the epitaxial wafer.

10. The method as claimed in claim 9, wherein thinning the semiconductor substrate includes etching the semiconductor substrate by a wet etching process that uses an etchant including hydrofluoric acid (HF), nitric acid (HNO$_3$), acetic acid (CH$_3$COOH), and phosphoric acid (H$_3$PO$_4$).

11. The method as claimed in claim 1, wherein the germanium concentration in the semiconductor substrate is less than $1.4E+20$ atoms/cm$^3$.

12. The method as claimed in claim 1, wherein annealing the epitaxial wafer is performed at a temperature of 900° C. to less than 950° C. under an atmosphere of an inert gas or a mixed gas of an inert gas and hydrogen gas.

13. A method of fabricating an epitaxial wafer, the method comprising:
   providing a semiconductor substrate in which boron and germanium are doped at a total concentration of $8.5E+18$ atoms/cm$^3$ or greater and a boron concentration is less than $2.2E+19$ atoms/cm$^3$;
   performing an epitaxial process in which the semiconductor substrate is used as a seed to form an epitaxial layer on the semiconductor substrate such that the epitaxial layer has a thickness of 5 μm or higher; and
   annealing the semiconductor substrate for 1 hour or longer at a temperature of 900° C. to 950° C.

14. The method as claimed in claim 13, wherein:
   germanium atoms substitute for ones of silicon atoms of the semiconductor substrate or ones of silicon and boron atoms of the semiconductor substrate.

15. The method as claimed in claim 13, wherein the germanium concentration in the semiconductor substrate is equal to or less than 6 times the boron concentration in the semiconductor substrate.

16. The method as claimed in claim 13, wherein annealing the semiconductor substrate is performed after forming the epitaxial layer on the semiconductor substrate.

17. The method as claimed in claim 13, further comprising performing a wet etching process to thin the semiconductor substrate after annealing the semiconductor substrate, wherein the wet etching process uses an etchant including hydrofluoric acid (HF), nitric acid ($HNO_3$), acetic acid ($CH_3COOH$), and phosphoric acid ($H_3PO_4$).

18. The method as claimed in claim 13, further comprising doping the epitaxial layer with boron,
wherein the boron is included in the epitaxial layer at a concentration of 1.0E+15 atoms/cm$^3$ or less.

19. The method as claimed in claim 13, wherein the germanium concentration in the semiconductor substrate is 3.0E+18 atoms/cm$^3$ to 1.6E+19 atoms/cm$^3$.

20. The method as claimed in claim 13, wherein annealing the epitaxial wafer is performed at a temperature of 900° C. to less than 950° C. under an atmosphere of an inert gas or a mixed gas of an inert gas and hydrogen gas.

* * * * *